(12) United States Patent
Suda

(10) Patent No.: US 7,940,072 B2
(45) Date of Patent: May 10, 2011

(54) TIMING GENERATOR AND SEMICONDUCTOR TEST APPARATUS

(75) Inventor: Masakatsu Suda, Tokyo (JP)

(73) Assignee: Advantest Corp., Tokyo (JP)

( * ) Notice: Subject to any disclaimer, the term of this patent is extended or adjusted under 35 U.S.C. 154(b) by 439 days.

(21) Appl. No.: 11/989,713

(22) PCT Filed: Jul. 28, 2006

(86) PCT No.: PCT/JP2006/314953
§ 371 (c)(1),
(2), (4) Date: May 27, 2008

(87) PCT Pub. No.: WO2007/013577
PCT Pub. Date: Feb. 1, 2007

(65) Prior Publication Data
US 2010/0060294 A1 Mar. 11, 2010

(30) Foreign Application Priority Data
Jul. 29, 2005 (JP) ................................. 2005-220766

(51) Int. Cl.
*G01R 31/26* (2006.01)
(52) U.S. Cl. .................................................. 324/762.01
(58) Field of Classification Search ................... 324/555, 324/765; 327/158, 564
See application file for complete search history.

(56) References Cited

U.S. PATENT DOCUMENTS

| | | | | |
|---|---|---|---|---|
| 6,128,248 A * | 10/2000 | Idei et al. | ................. | 365/233.11 |
| 6,144,713 A * | 11/2000 | Eto | ................. | 375/375 |
| 6,351,166 B2 * | 2/2002 | Hashimoto | ................. | 327/158 |
| 6,469,493 B1 * | 10/2002 | Muething et al. | ......... | 324/158.1 |
| 6,574,154 B2 * | 6/2003 | Sato et al. | ................. | 365/198 |
| 7,755,405 B2 * | 7/2010 | Yun et al. | ................. | 327/158 |
| 7,800,390 B2 * | 9/2010 | Suda | ................. | 324/750.3 |
| 2002/0057118 A1 * | 5/2002 | Tang | ................. | 327/158 |
| 2005/0110544 A1 | 5/2005 | Suda et al. | | |
| 2009/0256577 A1 * | 10/2009 | Hasumi et al. | ............. | 324/555 |

FOREIGN PATENT DOCUMENTS

| | | |
|---|---|---|
| JP | 08-051346 | 2/1996 |
| JP | 08-330921 | 12/1996 |
| JP | 10-093406 | 4/1998 |
| JP | 2001-235521 | 8/2001 |
| JP | 2002-261592 | 9/2002 |

* cited by examiner

*Primary Examiner* — Ha Tran T Nguyen
*Assistant Examiner* — Joshua Benitez
(74) *Attorney, Agent, or Firm* — Muramatsu & Associates

(57) ABSTRACT

A variable delay circuit has a simple configuration for being incorporated in a timing generator to control a delay time in real time and assure a timing margin. The variable delay circuit of the timing generator includes a delay circuit having a plurality of cascaded clock buffers; a plurality of cascaded data buffers; and data holding circuits for outputting data to the data buffers in accordance with the clock from the delay circuit. The delay amount added to the data by the data buffers is made identical to the delay amount added to the clock by the clock buffers.

7 Claims, 7 Drawing Sheets

(a) SINGLE SIMPLIFIED DELAY CIRCUIT (b) SINGLE DELAY CIRCUIT (c) DIFFERENTIAL DELAY CIRCUIT

TIMING GENERATOR AND SEMICONDUCTOR TEST APPARATUS

TECHNICAL FIELD

The present invention relates to a timing generator for providing a predetermined delay amount to a data signal by use of a variable delay circuit and then outputting the data signal, and to a semiconductor test apparatus equipped with this timing generator. More particularly, it relates to a timing generator which has a simplified circuit for controlling a variable delay circuit in real time and which makes it possible to easily assure a timing margin (eye aperture), and to a semiconductor test apparatus equipped with this timing generator.

BACKGROUND ART

Before describing the present invention, a conventional semiconductor test apparatus is explained with reference to FIG. 4 to make it easier to understand the present invention.

As shown in FIG. 4, a semiconductor test apparatus 100 generally comprises a period generator 400, a pattern generator 300, a timing generator 200, a waveform formatter 500 and a logical comparison circuit 600.

The period generator 400 outputs period data on the basis of an input reference clock. The period data is sent to the pattern generator 300 and also sent to the timing generator 200 as a Rate signal (see FIG. 7). The period generator 400 also generates an address for saving data in memories 220, 230 in the timing generator 200 described later (see FIGS. 5, 7).

The pattern generator 300 outputs a test pattern signal and an expected value pattern signal on the basis of the period data. The test pattern signal is sent to the timing generator 200, and the expected value pattern signal is sent to the logical comparison circuit 600.

The reference clock signal, the test pattern signal and the period data signal (Rate signal) are input to the timing generator 200, and the timing generator 200 outputs a formatted clock signal and a comparative clock signal. The formatted clock signal is sent to the waveform formatter 500, and the comparative clock signal is sent to the logical comparison circuit 600.

The waveform formatter 500 formats the formatted clock signal into a waveform necessary for a test, and then sends a formatted pattern signal to a semiconductor device under test (hereinafter also abbreviated as "DUT" (device under test)) 700.

The logical comparison circuit 600 compares a response output of the DUT 700 with the expected value pattern signal on the basis of the comparative clock signal. Thus, whether the DUT 700 is good or bad is judged depending on whether the response output corresponds to the expected value pattern signal.

Next, the basic configuration of the timing generator is explained with reference to FIGS. 5 to 7.

FIGS. 5 and 6 show an example of a circuit for controlling a timing generator generally used at present and a variable delay circuit of the timing generator in real time. FIG. 5 shows a diagram of the whole configuration of the timing generator, and FIG. 6 shows a diagram of a detailed configuration of a multiplexer (MUX) and its periphery in the timing generator.

Moreover, FIG. 7 is a timing chart showing the operation of the timing generator.

As shown in FIG. 5, the timing generator 200 comprises a counter 210, first storage means (memory (U)) 220, second storage means (memory (L)) 230, a calibration data storage means (CAL Data) 240, a correspondence detection circuit 250, an adder 260, clock period delay means 270, a decoder 280 and a variable delay circuit 290 as shown, for example, in Japanese Patent Publication Laid-open No. 2001-235521 and Japanese Patent Publication Laid-open No. 8-94725.

Furthermore, as shown in FIG. 5, the variable delay circuit 290 includes a delay circuit 291 and a multiplexer (MUX) 292. As shown in FIG. 6, the delay circuit 291 has a plurality of cascaded clock buffers 293-1 to 293-n, and the MUX 292 comprises a plurality of AND circuits 294-0 to 294-n connected to the corresponding stages of the delay circuit 291, FIFOs 295-0 to 295-n respectively connected to the AND circuits 294-0 to 294-n, and an OR circuit 296 to which outputs of the plurality of AND circuits 294-0 to 294-n are input and which then outputs TG Out (a timing signal).

As shown in FIG. 7, a Refclk signal is input to the timing generator 200. It is to be noted that the period of the Refclk signal is 10 ns (FIG. 7(a)).

The output timing (test cycle TC) of a timing signal (TG Out, a delay clock in the semiconductor test apparatus 100) output from the timing generator 200 includes a point (TC1) 5 ns from a first start, and a point (TC2) 12 ns from a first start (after one period of the Refclk signal from the first start) (FIG. 7(b)).

A Rate signal indicating a start point is input to the timing generator 200 (FIG. 7(c)). In response to the input of the Rate signal, the counter 210 is cleared to 0 (FIG. 7(d)). Then, when the Rate signal is not input, the counter 210 is incremented one by one at each period of the Refclk signal (FIG. 7(d)).

The first storage means 220 stores a quotient when the test cycle (TC) of the output signal (TG Out) is divided by the period of the Refclk signal.

Furthermore, the second storage means 230 stores a remainder when the test cycle (TC) of the output signal (TG Out) is divided by the period of the Refclk signal.

For example, with regard to 5 ns which is the test cycle of the first output signal, the quotient and remainder are calculated using the following equation:

$$5 \div 10 = 0 \ldots 5 \quad \text{(Equation 1)}$$

A quotient of 0 and a remainder of 5 ns are calculated by Equation 1. Based on the calculation results, the quotient "0" is stored in the first storage means 220, and the remainder "5 ns" is stored in the second storage means 230 (FIG. 7(e), (f)).

Moreover, with regard to 12 ns which is the test cycle of the second output signal, the quotient and remainder are calculated using the following equation:

$$12 \div 10 = 1 \ldots 2 \quad \text{(Equation 2)}$$

A quotient of 1 and a remainder of 2 ns are calculated by Equation 2. Based on the calculation results, the quotient "1" is stored in the first storage means 220, and the remainder "2 ns" is stored in the second storage means 230 (FIG. 7(e), (f)).

Furthermore, the correspondence detection circuit 250 detects the correspondence between a counted value of the counter 210 and data stored in the first storage means 220. The correspondence detection circuit 250 outputs a detection signal when the two correspond to each other, but outputs no detection signal when the two do not correspond to each other.

For example, at the first cycle of the Refclk signal, the counted value corresponds to the stored data because the counter indicates "0" and the memory quotient is "0". In this case, a detection signal is output (FIG. 7(g)).

Furthermore, for example, at the second cycle of the Refclk signal, the counted value does not correspond to the stored data because the counter indicates "0" and the memory quotient is "1". In this case, no detection signal is output (FIG. 7(g)).

Then, for example, at the third cycle of the Refclk signal, the counted value corresponds to the stored data because the counter indicates "1" and the memory quotient is "1". In this case, a detection signal is output (FIG. 7(g)).

In response to the detection signal from the correspondence detection circuit 250 and an addition result (Carry) from the adder 260, the clock period delay means 270 sends a delay amount signal (coarse resolution delay amount signal) whose resolution corresponds to one cycle of the Refclk signal to the variable delay circuit 290. In this manner, the position of the timing retrieved from the Refclk is shifted.

In accordance with the addition result in the adder 260 based on the data stored in the second storage means 230 and the CAL Data in the calibration data storage means 240, the decoder 280 sends a delay amount signal (fine resolution delay amount signal) whose resolution corresponds to a time less than one cycle of the Refclk signal to the variable delay circuit 290.

That is, the output signal of the decoder 280 is a signal for controlling "which stage number of the MUX to be output", and the output signal of the clock period delay means 270 is a signal for controlling "whether to validate or invalidate the selection of the MUX" (Output Enable).

As shown in FIGS. 5 and 6, the delay circuit 291 of the variable delay circuit 290 has the plurality of cascaded clock buffers 293-1 to 293-n, and is divided into a plurality of stages so that the delay amount of each stage may be the same.

For example, if the delay amount of the whole delay circuit 291 is 10 ns and this delay circuit 291 is separated into ten stages, each stage has a delay amount of 1 ns. Then, if the MUX 292 divides the delay circuit 291 into ten stages, it is possible to provide the output signal (TG Out) with a delay of 0 ns at a zeroth stage, a delay of 1 ns at a first stage, a delay of 2 ns at a second stage, a delay of 3 ns at a third stage, and a delay of 9 ns at a ninth stage.

In addition, a clock (Clock (VD)) is input to the delay circuit 291, and the delay circuit 291 provides a predetermined delay amount to the clock at each stage and sends the result to the MUX 292.

As shown in FIG. 6, the AND circuits 294-0 to 294-n of the MUX 292 are provided to correspond to the respective stages of the delay circuit 291. For example, if the delay circuit 291 is separated into ten stages, the number of AND circuits 294-0 to 294-n provided is 9+1 (nine circuits corresponding to the zeroth stage to the ninth stage, and one circuit corresponding to the zeroth stage).

Furthermore, each of the AND circuits 294-0 to 294-n inputs the clock from the corresponding stage of the delay circuit 291 to one input terminal. For example, a clock provided with a delay amount (1 ns in the above-mentioned example) of one stage is input to the AND circuit 294-1 corresponding to the first stage. Further, a clock provided with a delay amount (2 ns in the above-mentioned example) of two stages is input to the AND circuit 294-2 corresponding to the second stage. Sill further, a clock provided with a delay amount (1×n [ns] in the above-mentioned example) of n stages is input to the AND circuit 294-n corresponding to the n-th stage. Further yet, a clock provided with a delay amount of zero stages (i.e., a clock with a delay amount of 0) is input to the AND circuit 294-0 corresponding to the zeroth stage.

Moreover, output signals of the FIFOs 295-0 to 295-n are input to the other input terminals of the AND circuits 294-0 to 294-n.

The FIFOs 295-0 to 295-n are connected to the corresponding stages of the delay circuit 291, in the same manner as the AND circuits 294-0 to 294-n. For example, if the delay circuit 291 is separated into ten stages, the number of FIFOs 295-0 to 295-n provided is 9+1 (nine FIFOs corresponding to the zeroth stage to the ninth stage, and one FIFO corresponding to the zeroth stage).

The delay amount signal (fine resolution delay amount signal) sent from the decoder 280 is input to the FIFOs 295-0 to 295-n. Then, the FIFOs 295-0 to 295-n output delay amount signals by a first-in first-out method on the basis of a clock (Clock (Logic)) and a clock (Clock (VD)), and send the delay amount signals to the AND circuits 294-0 to 294-n.

Here, the delay amount signal from the decoder 280 selects the FIFO 295-0 to 295-n and AND circuit 294-0 to 294-n to be operated. For example, when the output signal (TG Out) is output at the first test cycle (TC) shown in FIG. 7(b), a delay amount signal for operating the FIFO 295-5 and the AND circuit 294-5 corresponding to the fifth stage of the delay circuit 291 is output in order to provide a delay amount of 5 ns to the output signal (TG Out). Thus, the FIFO 295-5 and the AND circuit 294-5 alone are operated, and the output signal (TG Out) provided with a delay amount of 5 ns is output (FIG. 7(h)).

The output signals of the AND circuits 294-0 to 294-n are input to the OR circuit 296, and the OR circuit 296 outputs the output signal (TG Out) by OR.

Thus, the variable delay circuit 290 is a circuit for selecting a predetermined stage number of the cascaded circuit (the delay circuit 291) of the buffers 293-1 to 293-n to obtain a desired delay time for a timing signal (TG Out), wherein the writing of data is common in the respective stages but the timing of reading is different depending on the stage (the FIFOs 295-0 to 295-n are used).

That is, the timing generator 200 is capable of generating a desired delay time in an analog manner by the configuration described above.

DISCLOSURE OF THE INVENTION

However, because of the increasing speed of timing generators, it has recently become more difficult to assure the timing margin of a circuit for controlling (on the fly) a variable delay circuit of the timing generator in real time, leading to a problem of requiring a large amount of time and work in designing, timing inspection and corrections.

For example, the use of a FIFO in the variable delay circuit as shown in FIG. 6 has caused the above-mentioned problem.

A FIFO generally comprises a plurality of latch circuits for extending the eye of data, a counter for controlling the selection of a latch, a selector for selecting data in the latch, etc. Here, the operating frequency of a reading circuit of the FIFO is determined by the propagation delay time of the counter and the selector, so that the operation is limited to 250 MHz to 400 MHz.

That is, the FIFO can operate at a speed of about 250 megahertz, but is not operable at a level of one gigahertz.

Therefore, there has been a demand for a new configuration to replace the FIFO so that high-speed operation can be handled.

The present invention has been made in view of the foregoing problem, and is directed to provide a timing generator and a semiconductor test apparatus which can simplify the configuration of a circuit for controlling a variable delay circuit of the timing generator in real time and which can assure a timing margin (eye aperture).

In order to achieve this object, the present invention provides a timing generator which is equipped with a variable delay circuit to provide a predetermined delay amount to a timing signal and then output the timing signal, the variable delay circuit comprising: a delay circuit having a plurality of cascaded clock buffers; a plurality of AND circuits each being provided to correspond to each stage of the delay circuit divided by a predetermined delay time, a clock being input to one input terminal of the AND circuit from the corresponding stage of the delay circuit; and a plurality of data buffers each being connected to the other input terminal of corresponding one of the plurality of AND circuits, the data buffer receiving data and providing a given delay amount to the received data and then sending the data to the AND circuits, wherein the delay amount provided to the data by the data buffer is the same as the delay amount provided to the clock by the clock buffer of the stage corresponding to the AND circuit to which the data buffer is connected.

In such a configuration of the timing generator, there is provided a data buffer to provide a given delay amount to the input data, and the delay amount of this data buffer is the same as the delay amount of the clock buffer of the delay circuit corresponding to this data buffer, which makes it possible to easily maintain the timing margin (eye aperture).

It is to be noted that the eye aperture here means an opening portion (central opening portion shaped like an eye) formed in the center of a waveform produced by the superposition of clock waveforms of the respective periods.

Moreover, it is not necessary to incorporate a complicated and massive configuration of electric components such as a FIFO including latch circuits, a counter, a selector, etc., so that it is possible to simplify a circuit for controlling (on the fly) a variable delay circuit of a timing generator in real time.

In addition, the FIFO is not used in the configuration of the control circuit, so that high-speed operation at a level of one gigahertz can be handled.

Furthermore, the timing generator of the present invention is configured to comprise a delay locked loop circuit, in which a clock signal is input to the delay circuit and a clock signal output from the delay circuit is input to the delay locked loop circuit, and the delay locked loop circuit generates a bias signal on the basis of these clock signals and provides the bias signal to the data buffer.

In such a configuration of the timing generator, the delay amount of the data buffer is controlled by the delay locked loop circuit (DLL), and a change in an external power supply voltage or temperature, if any, is compensated, so that it is possible to maintain a constant delay time of a signal for controlling the delay time of the variable delay circuit and the variable delay circuit in real time, and the eye aperture of data can be maintained.

Furthermore, the timing generator of the present invention is configured to comprise a data holding circuit, in which the data is input to the data holding circuit, the clock input to the delay circuit is input to the data holding circuit, and the data holding circuit outputs the data in accordance with the input timing of this clock and sending the data to data buffer.

In such a configuration of the timing generator, a signal for controlling the variable delay circuit in real time is latched at a clock in phase with the input signal of the variable delay circuit, and this latched signal can add a delay amount equal to that of the buffer (delay element) of the variable delay circuit. Moreover, the data buffer is configured by the cascade of buffers having current sources and has a delay amount equal to that of the buffer used in the variable delay circuit, so that the same bias voltage can be provided to the data buffer.

Furthermore, the present invention provides a semiconductor test apparatus which includes: a period generator which outputs period data on the basis of an input reference clock; a pattern generator which outputs a test pattern signal and an expected pattern signal on the basis of the period data; a timing generator to which the reference clock, the period data and the test pattern signal being input so that the timing generator outputs a formatted clock signal and a comparative clock signal; a waveform formatter which formats the formatted clock signal to supply a formatted pattern signal to a semiconductor device; and a logical comparison circuit which compares a response output of the semiconductor device with an expected pattern signal on the basis of the comparative clock signal, wherein the timing generator comprises a variable delay circuit described in the foregoing.

When the semiconductor test apparatus has such a configuration, a delay clock signal of good quality maintaining an eye aperture can be obtained from the timing generator. This can increase measurement accuracy in various tests of a DUT.

As described above, according to the present invention, the data buffer having a delay amount equal to that of the clock buffer of the delay circuit is provided, and it is thus possible to easily maintain timing margin (eye aperture).

Furthermore, the delay amount of the data buffer is controlled by the DLL, and a change in an external power supply voltage or temperature, if any, is therefore compensated, so that it is possible to maintain a constant delay time of a signal for controlling the delay time of the variable delay circuit and the variable delay circuit in real time, and consequently, the eye aperture of data can be maintained.

Moreover, since the present invention is not using a complicated and massive configuration of electric components such as a FIFO, it is possible to simplify a circuit for controlling (on the fly) a variable delay circuit of the timing generator in real time.

In addition, the FIFO is not used in the configuration of the control circuit, so that high-speed operation at a level of one gigahertz can be handled.

DESCRIPTION OF REFERENCE NUMBERS

Figure 1:
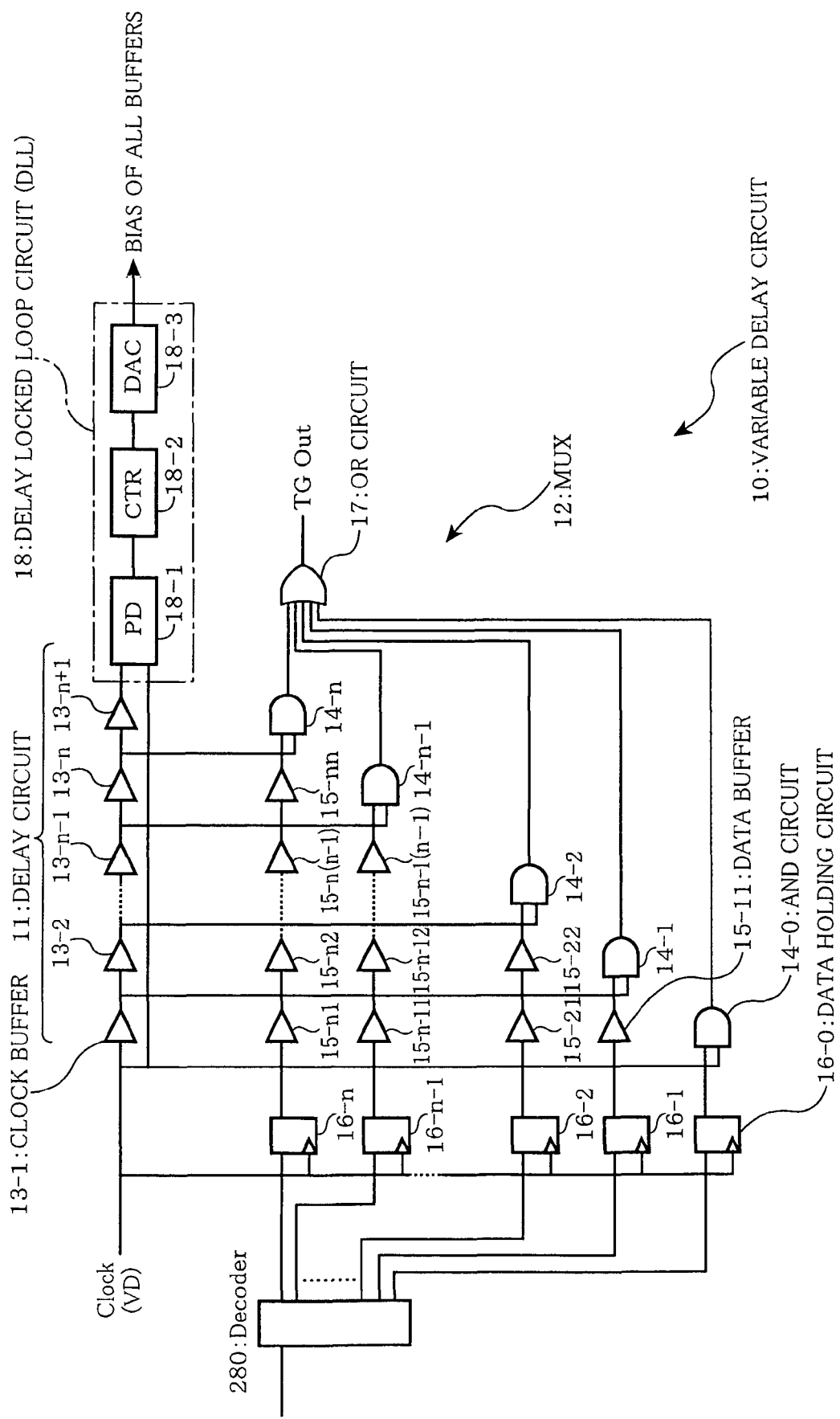
FIG. 1 is a circuit diagram showing the configuration of a timing generator (variable delay circuit) of the present invention.

10 variable delay circuit
11 delay circuit
12 multiplexer (MUX)
13-1 to 13-n+1 clock buffers 14-0 to 14-n AND circuits
15-11 to 15-nn data buffers
16-0 to 16-n data holding circuits
17 OR circuit
18 delay locked loop circuit (DLL)
100 semiconductor test apparatus
200 timing generator
280 decoder
300 pattern generator
500 waveform formatter
600 logical comparison circuit
700 DUT

BEST MODE FOR CARRYING OUT THE
INVENTION

A preferred embodiment of a timing generator and a semiconductor test apparatus according to the present invention will hereinafter be described with reference to the drawings.

First, the embodiment of the timing generator of the present invention will be described with reference to FIG. 1.

FIG. 1 is a block diagram showing the configuration of the timing generator of the present embodiment.

Figure 5:
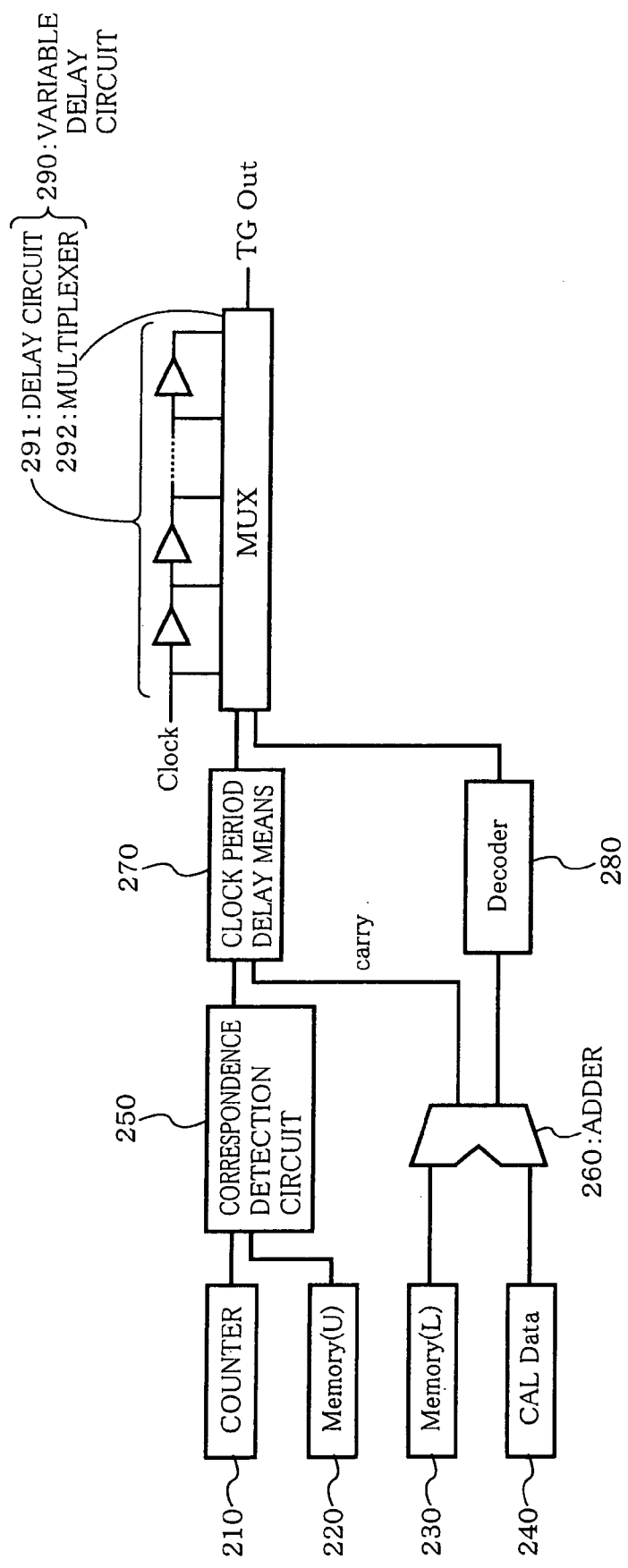
FIG. 5 is a circuit diagram showing the configuration of a conventional timing generator.
Figure 6:
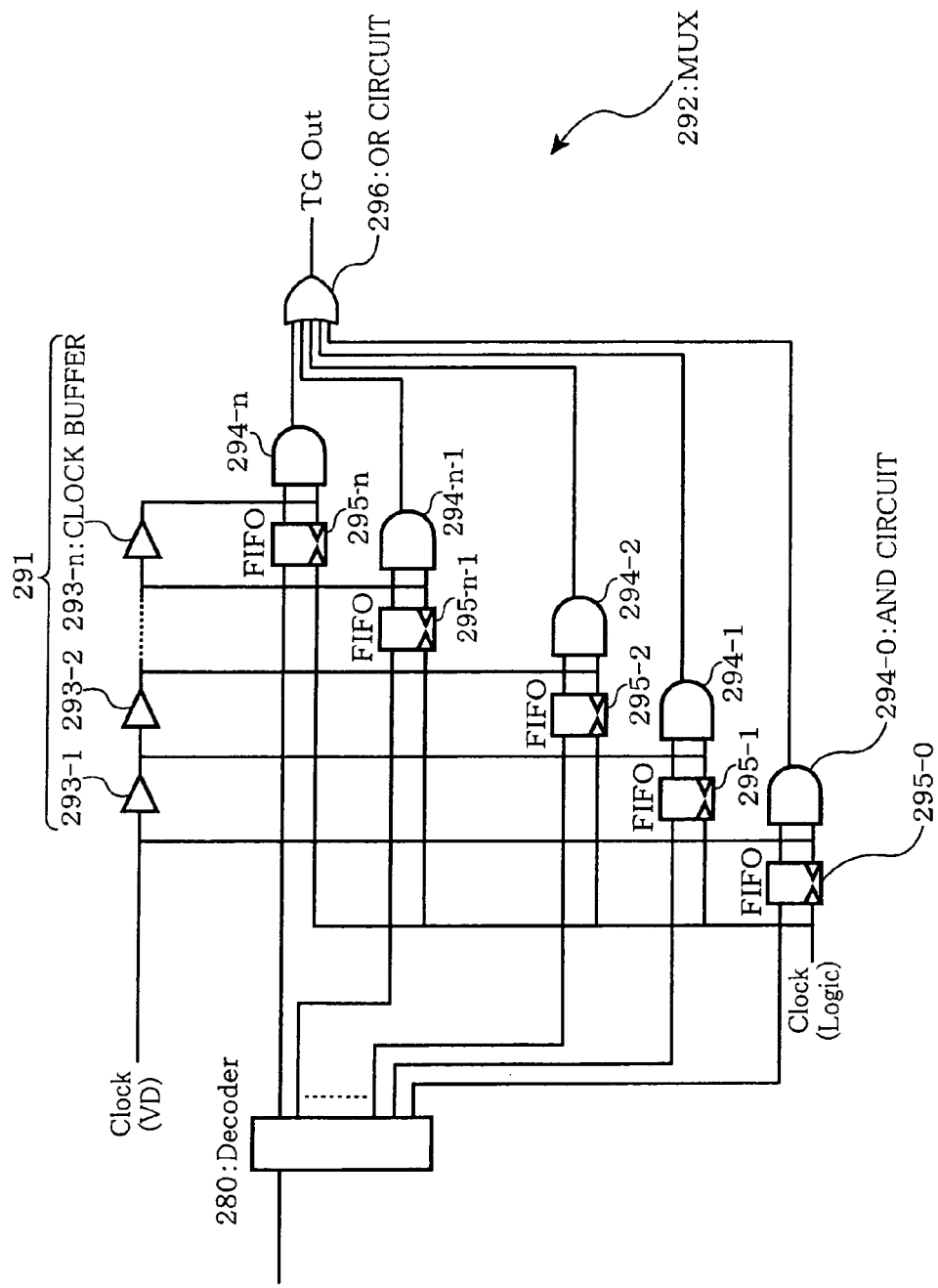
FIG. 6 is a circuit diagram showing the configuration of a conventional variable delay circuit.
Figure 7:
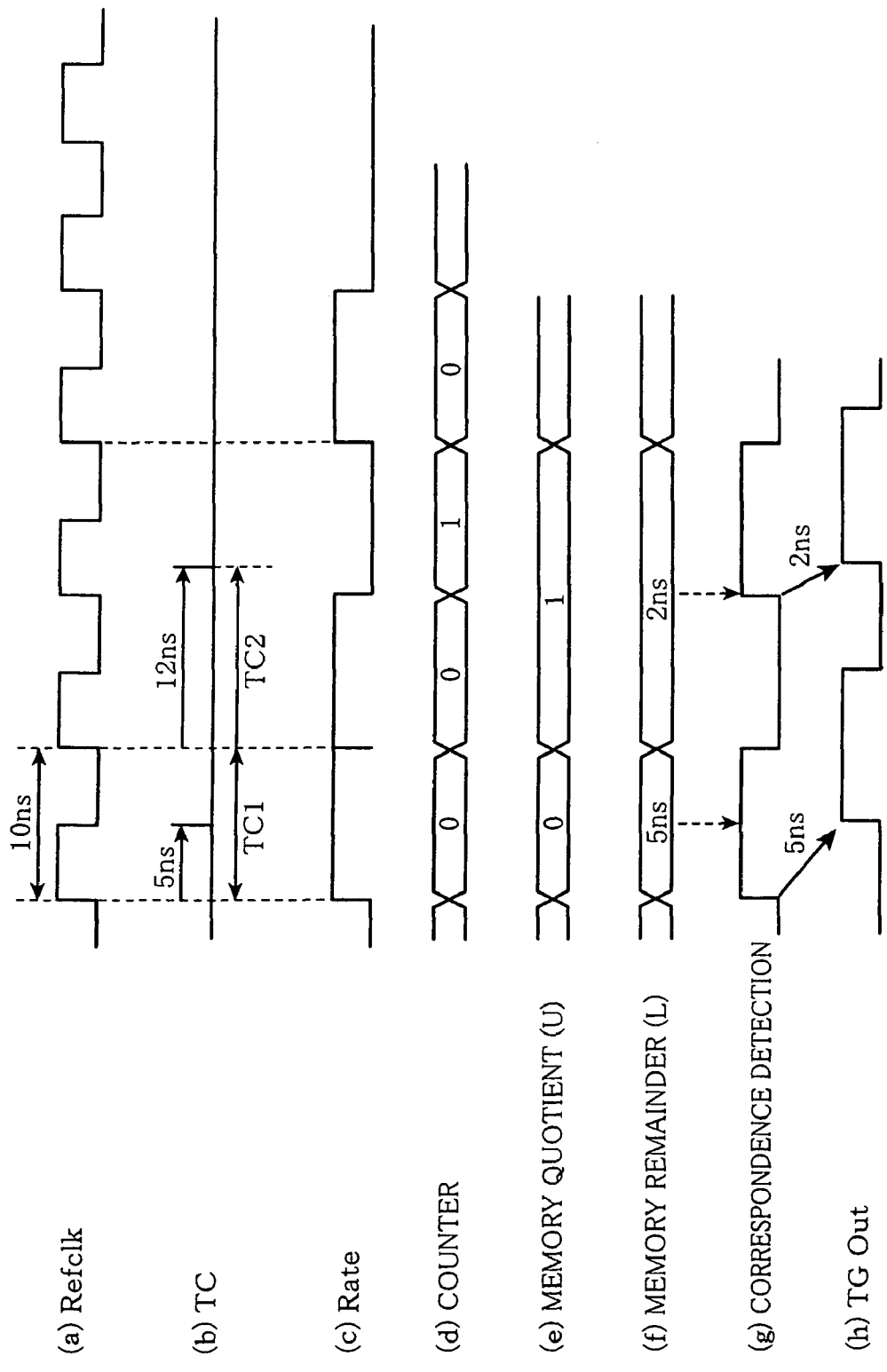
FIG. 7 is a timing chart showing the result of the operation of a conventional timing generator (variable delay circuit).

The timing generator of the present embodiment is different from the conventional timing generator shown in FIGS. 5 and 6 in the configuration of a variable delay circuit. That is, FIFOs are used for the variable delay circuit in the conventional timing generator, whereas in the timing generator of the present embodiment, there are provided data buffers and data holding circuits in place of the FIFOs, and there is also provided a delay locked loop circuit (DLL). Other components are similar to those in the conventional timing generator.

Therefore, in FIG. 1, the same reference numbers are assigned to components similar to those in FIGS. 5 and 6, and these components are not described in detail.

As shown in FIG. 1, a variable delay circuit 10 of the timing generator of the present embodiment comprises a delay circuit 11, a multiplexer (MUX) 12 and a delay locked loop circuit (DLL) 18.

The delay circuit 11 has a configuration similar to that of the delay circuit 291 in the conventional timing generator 200, and comprises a plurality of cascaded clock buffers 13-1 to 13-n+1. However, the clock buffer 13-n+1 at the final stage is a buffer which is additionally incorporated when the DLL 18 is connected.

In addition, the configuration of the clock buffers 13-1 to 13-n+1 can be varied depending on the amount of a desired delay time. For example, although not illustrated in FIG. 1, a logical circuit including 210, 220, 230, 240, 250, 260 and 270 in FIG. 5 can be used as a delay element for generating a delay time longer than a clock period. A combination of such logical circuits makes it possible to easily obtain a delay time which is an integral multiple of the clock period. For example, when the clock period is 4 nanoseconds (ns), it is possible to easily obtain a delay time of 8 ns, 12 ns, 16 ns, or etc. which is an integral multiple of this clock period.

Moreover, serially connected inverters can be used as delay elements for generating a delay time shorter than the clock period and longer than a delay amount of two stages of inverters. Although not illustrated in FIG. 1, it is also possible to use, at a stage subsequent to an OR circuit 17, a delay element for generating a delay time shorter than the delay amount of two stages of inverters, for example, the load capacity of an inverter.

As shown in FIG. 1, the MUX 12 comprises AND circuits 14-0 to 14-n, data buffers 15-11 to 15-nn, data holding circuits 16-0 to 16-n, and the OR circuit 17.

The AND circuits 14-0 to 14-n have a configuration similar to that of the AND circuits 294-0 to 294-n in the conventional timing generator 200, and are provided to correspond to the respective stages of the delay circuit 11.

A clock is input to one input terminal of the AND circuit 14-0 to 14-n from the corresponding stage of the delay circuit 11. On the other hand, an output signal (data from the data holding circuit 16) of the data buffer 15-11 to 15-nn is input to the other input terminal of the AND circuit 14-0 to 14-n. Then, all the outputs of the plurality of AND circuits 14-0 to 14-n are sent and input to the OR circuit 17.

The data buffers 15-11 to 15-nn are composed of a plurality of cascaded data buffers having current sources, and are provided with the same bias voltage by the DLL 18.

The input sides of the cascaded data buffers 15-11 to 15-nn are connected to output terminals of the data holding circuits 16-0 to 16-n. Further, the output sides thereof are connected to the other input terminals of the plurality of AND circuits 14-0 to 14-n. That is, the cascaded data buffers 15-11 to 15-nn are connected to the input terminals (other input terminals) of the plurality of AND circuits 14-0 to 14-n.

Furthermore, the data buffer 15-11 to 15-nn has the same delay amount as the delay amount at the stage of the delay circuit 11 corresponding to the AND circuit 14-0 to 14-n to which this data buffer 15-11 to 15-nn is connected.

For example, the data buffer 15-11 which is connected to the other input terminal of the AND circuit 14-1 connected to the corresponding first stage of the delay circuit 11 has the same delay amount as that of the clock buffer 13-1, that is, up to the first stage of the delay circuit 11. Further, the data buffers 15-21 to 15-22 which are connected to the other input terminal of the AND circuit 14-2 connected to the corresponding second stage of the delay circuit 11 has the same delay amount as that of the clock buffers 13-1 to 13-2, that is, up to the second stage of the delay circuit 11. Still further, the data buffers 15-n1 to 15-nn which are connected to the other input terminal of the AND circuit 14-n connected to the corresponding n-th stage of the delay circuit 11 has the same delay amount as that of the clock buffers 13-1 to 13-n, that is, up to the n-th stage of the delay circuit 11.

It should be noted that a data buffer is not connected to the other input terminal of the AND circuit 14-0 that is connected to the corresponding zeroth stage of the delay circuit 11. The reason is that the delay amount of the clock buffers up to the zeroth stage of the delay circuit 11 is 0.

Since the data buffers 15-11 to 15-nn have such a configuration, the same delay amount can be provided to both the clock in the delay circuit 11 and the data in the MUX 12. Thus, the eye aperture of the data can be maintained.

The configuration of the data buffers 15-11 to 15-nn is explained in "the configurations of the clock buffer and the data buffer" described later.

The data holding circuits 16-0 to 16-n can be configured by, for example, latch circuits, and are provided to correspond to the respective stages of the delay circuit 11, in the same manner as the AND circuits 14-0 to 14-n. For example, if the delay circuit 11 is separated into ten stages, the number of data holding circuits 16-0 to 16-n provided is 10+1 (ten circuits corresponding to ten stages, and one circuit corresponding to the zeroth stage).

A delay amount signal (fine resolution delay amount signal) sent from a decoder 280 is input to the data holding circuits 16-0 to 16-n. Hereafter, since the delay amount signal indicates an amount of delay, within the context of the present invention, this term is referred to as "delay amount data". The data holding circuits 16-0 to 16-n output the delay amount data in accordance with the input timing of the clock (Clock (Logic)), and send the delay amount data to the data buffers 15-11 to 15-nn (the other input terminal of the AND circuit 14-0 at the zeroth stage).

Here, the delay amount data from the decoder 280 selects the data holding circuit 16-0 to 16-n, the data buffer 15-11 to 15-nn and the AND circuit 14-0 to 14-n to be operated. Thus, the particular data holding circuit 16-0 to 16-n, data buffer 15-11 to 15-nn and AND circuit 14-0 to 14-n alone are operated, and an output signal (TG Out) provided with a desired delay amount is output.

This enables the data holding circuits 16-0 to 16-n to latch the delay amount data in phase with a clock (Clock (VD)) of the delay circuit 11. Then, the data buffers 15-11 to 15-nn can be synchronized with the same delay amount as that of the clock buffers 13-1 to 13-n (delay elements) of the delay circuit 11 to the latched signal. Thus, the eye aperture of the data can be maintained.

The output signals of the AND circuits 14-0 to 14-n are input to the OR circuit 17, and the OR circuit 17 outputs the output signal (TG Out) by OR.

As shown in FIG. 1, the delay locked loop (DLL) 18 comprises a phase comparator (PD) 18-1, a counter (CTR) 18-2 and a DA converter (DAC) 18-3.

The clock input to the delay circuit 11 and the clock output from the delay circuit 11 are input to the phase comparator 18-1, and the phase comparator 18-1 detects a phase between these signals and outputs the result of the detection as a phase signal.

The phase signal is input to the counter 18-2 from the phase comparator 18-1, and the counter 18-2 generates a control signal on the basis of the phase signal and outputs the control signal.

The DA converter 18-3 subjects the control signal from the counter 18-2 to digital-to-analog conversion, and outputs the converted signal as a delay time control signal (BIAS signal). This BIAS signal is provided to all of the data buffers 15-11 to 15-nn.

When the BIAS is thus generated in the DLL 18 and then output, the delay times of the data buffers 15-11 to 15-nn can be controlled by the DLL 18, so that a change in an external power supply voltage or temperature, if any, is compensated, which maintains a constant delay time of a signal for controlling the delay time of the variable delay circuit and the variable delay circuit in real time (maintains the eye aperture).

Next, the configurations of the clock buffer and the data buffer will be explained with reference to FIG. 2.

Figure 2:
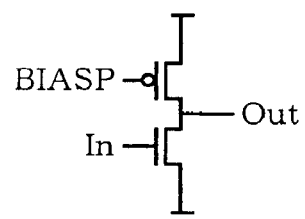
FIG. 2 shows circuit diagrams of configuration examples of a buffer, wherein (a) is a circuit diagram of a single simplified delay circuit, (b) is a circuit diagram of a single delay circuit, and (c) is a circuit diagram of a differential delay circuit.
Figure 2:
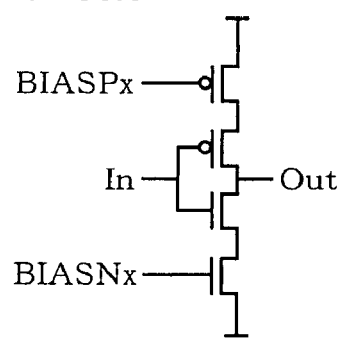
Figure 2:
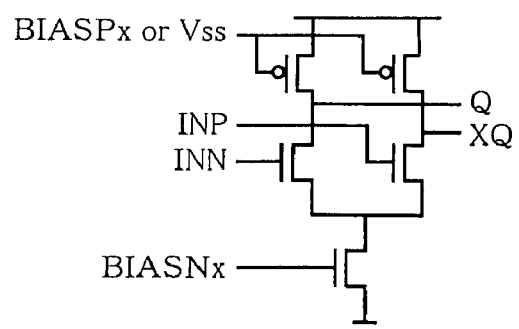

FIG. 2 shows circuit diagrams of configuration examples of the buffer (including both the clock buffer and the data buffer), wherein (a) shows a single simplified delay circuit, (b) shows a single delay circuit, and (c) shows a differential delay circuit. The clock buffer and the data buffer in the present invention can be configured by any one of (a), (b) and (c) in FIG. 2.

The single simplified delay circuit has a P-channel MOSFET and an N-channel MOSFET, as shown in FIG. 2(*a*).

The drain of the N-channel MOSFET is connected to the source of the P-channel MOSFET. The source of the N-channel MOSFET is grounded, and a predetermined voltage is applied to the drain of the P-channel MOSFET. Further, BIASP is input to the gate of the P-channel MOSFET, and a signal (a clock in a clock path, data in a data path) is input to the gate of the N-channel MOSFET (In). Then, a signal (a clock in the clock path, data in the data path) delayed in accordance with the BIASP is output from a connection point between the drain of the N-channel MOSFET and the source of the P-channel MOSFET (Out).

The single delay circuit has two P-channel MOSFETs and two N-channel MOSFETs, as shown in FIG. 2(*b*).

The source of the first P-channel MOSFET is connected to the drain of the second P-channel MOSFET. The source of the second P-channel MOSFET is connected to the drain of the first N-channel MOSFET. The source of the first N-channel MOSFET is connected to the drain of the second N-channel MOSFET. Further, the source of the second N-channel MOSFET is grounded, and a predetermined voltage is applied to the drain of the first P-channel MOSFET. Moreover, BIASPx is input to the gate of the first P-channel MOSFET, and BIASNx is input to the gate of the second N-channel MOSFET. A signal (a clock in a clock path, data in a data path) is input to the gate of the second P-channel MOSFET and the gate of the first N-channel MOSFET (In). Then, a signal (a clock in the clock path, data in the data path) delayed in accordance with the BIASPx and BIASNx is output from a connection point between the source of the second P-channel MOSFET and the drain of the first N-channel MOSFET (Out).

That is, the single delay circuit has a configuration in which a CMOS inverter is provided in the middle and current sources are provided on both sides of the CMOS inverter.

The differential delay circuit is a combination of two single simplified delay circuits in which the sources of N-channel MOSFETs are connected to each other and in which a predetermined voltage is applied to the drains of P-channel MOSFETs, as shown in FIG. 2(*c*). Further, the drain of a third N-channel MOSFET is connected to a point where the sources of the N-channel MOSFETs are connected to each other, and the source of the third N-channel MOSFET is grounded.

Furthermore, signals (INP on one side, INN on the other side) are input to the gates of the N-channel MOSFETs of the two single simplified delay circuits, and a signal (BIASPx or Vss) is input to the gates of the P-channel MOSFETs of the single simplified delay circuits.

Then, a signal Q is output from one of the two single simplified delay circuits, and a signal XQ is output from the other.

Here, the operation of the single delay circuit is further explained.

When the inverter in the middle of this single delay circuit makes the transition to Hi, a current runs from a Hi-side current source (the first P-channel MOSFET) to a load (Out), such that a load capacity is charged. On the other hand, when the inverter makes the transition to a Low side, the current is then released from the load side to the current source side to make the transition. These running currents are used as a current source by the MOSFETs connected to both sides of the single delay circuit, and are controlled so that the currents run both in charging and discharging.

A certain kind of bias generation source is connected to the source of the current, and the current source is connected by a current mirror to a transistor at the final stage of the bias generation source. Due to the current mirror connection, the current passed by one bias generator is mirrored, and each current is mirrored. Thus, all the transistors are limited by the currents close to the bias current, and the current with which the load capacity is charged is controlled when each buffer makes the transition.

Next, the result of the operation of the timing generator of the present invention is explained with reference to FIG. 3.

Figure 3:
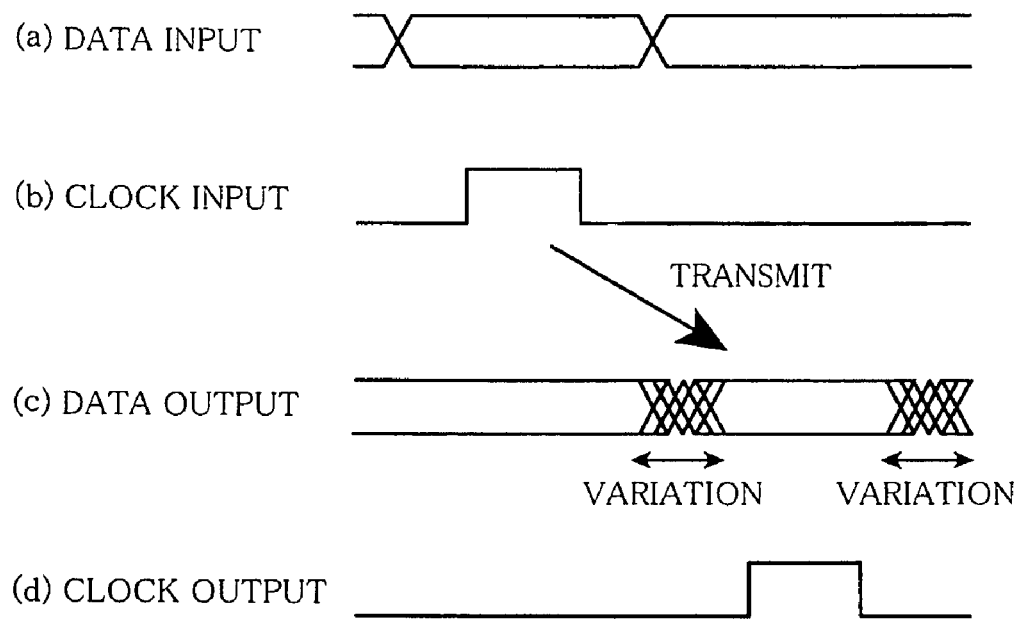
FIG. 3 is a timing chart showing the result of the operation of the timing generator (variable delay circuit) of the present invention.

FIG. 3 is a waveform chart showing waveforms of a data input (FIG. 3(*a*)), a clock input (FIG. 3(*b*)), a data output (FIG. 3(c)), and a clock output (FIG. 3(d)) in the variable delay circuit of the timing generator of the present embodiment.

In the variable delay circuit 10 of the present embodiment, the same delay amount as the delay amount added to the clock is also added to the data. This permits reduced effect of swings (variations) in the time direction of a data waveform, as shown in FIG. 3(c). This makes it possible maintain the eye aperture of the data.

Next, the semiconductor test apparatus of the present invention will be described.

Figure 4:
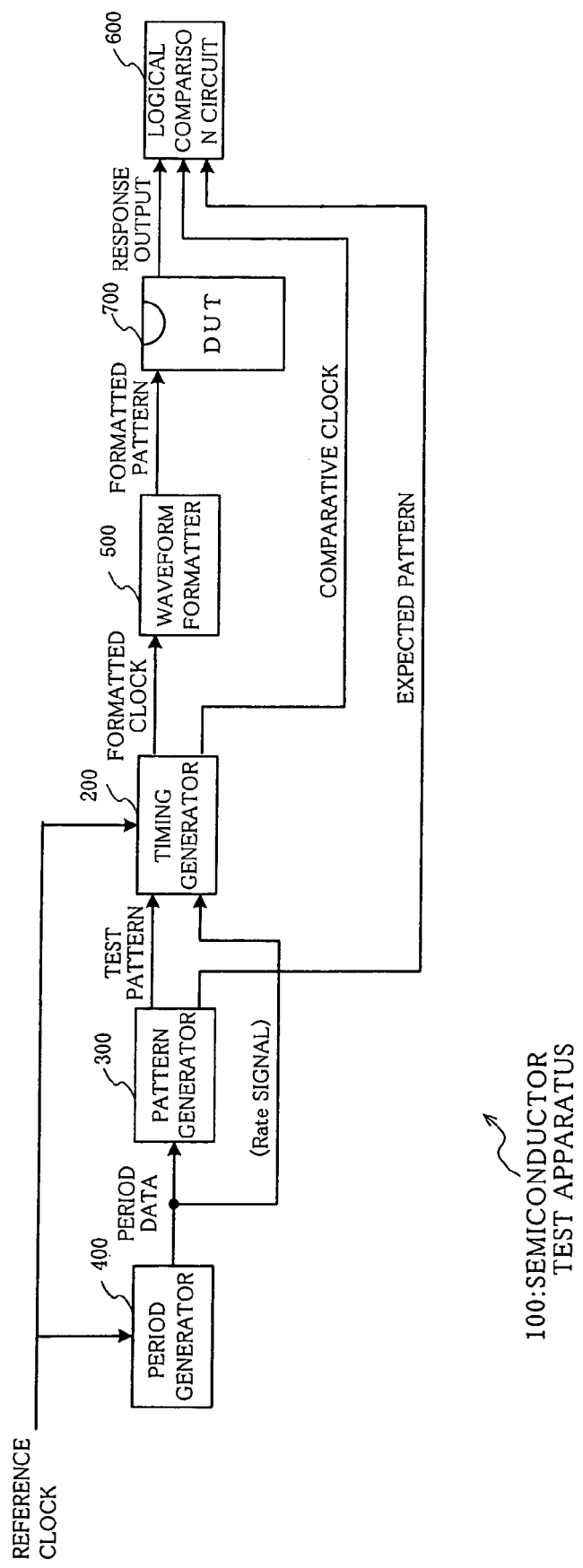
FIG. 4 is a block diagram showing the configuration of a conventional semiconductor test apparatus.

The semiconductor test apparatus of the present invention has a configuration equipped with the above-mentioned timing generator having the variable delay circuit 10. The configuration except for this timing generator is similar to the configuration shown in FIG. 4.

When the timing generator of the present embodiment is thus used, it is possible to assure an eye aperture for performing gigahertz operation and to run various high-speed tests of a DUT 700. This can increase the speed of a semiconductor test.

While the preferred embodiment of the timing generator and the semiconductor test apparatus of the present invention has been described above, it should be understood that the timing generator and the semiconductor test apparatus according to the present invention are not exclusively limited to the embodiment described above, and various modifications can be made within the scope of the invention.

For example, the number of stages of the delay circuit is ten in the embodiment described above, but the number of stages of the delay circuit is not limited to ten and can be any number.

Moreover, the data holding circuit is configured by the latch circuit in the embodiment described above, but is not limited to the latch circuit and can also be configured by, for example, a flip-flop.

The present invention relates to a technique for adding a predetermined delay amount to data in a variable delay circuit, and is therefore applicable to a timing generator equipped with a variable delay circuit, a semiconductor test apparatus, and other apparatuses.

The invention claimed is:

1. A timing generator which is equipped with a variable delay circuit to provide a predetermined delay amount to a timing signal and then output the timing signal,
   the variable delay circuit comprising:
   a delay circuit having a plurality of cascaded clock buffers;
   a plurality of AND circuits each being provided to correspond to each stage of the delay circuit divided by a predetermined delay time, a clock being input to one input terminal of the AND circuit from the corresponding stage of the delay circuit; and
   a plurality of data buffers each being connected to the other input terminal of corresponding one of the plurality of AND circuits, the data buffer receiving delay amount data and providing a given delay amount to the received data and then sending the data to the AND circuits,
   wherein the delay amount provided to the data by the data buffer is the same as the delay amount provided to the clock by the clock buffer of the stage corresponding to the AND circuit to which the data buffer is connected.

2. The timing generator according to claim 1, further comprising:
   a delay locked loop circuit which is provided with a clock signal input to the delay circuit and a clock signal output from the delay circuit, wherein the delay locked loop circuit generates a bias signal on the basis of these clock signals and provides the bias signal to the data buffer.

3. The timing generator according to claim 2, further comprising:
   a data holding circuit which is provided with the delay amount data, wherein the clock input to the delay circuit is input to the data holding circuit, and wherein the data holding circuit outputs the delay amount data in accordance with the input timing of this clock and sends the delay amount data to data buffer.

4. The timing generator according to claim 1, further comprising:
   a data holding circuit which is provided with the delay amount data, wherein the clock input to the delay circuit is input to the data holding circuit, and wherein the data holding circuit outputs the delay amount data in accordance with the input timing of this clock and sends the delay amount data to data buffer.

5. A semiconductor test apparatus for testing semiconductor devices, comprising:
   a period generator which outputs period data on the basis of an input reference clock;
   a pattern generator which outputs a test pattern signal and an expected pattern signal on the basis of the period data;
   a timing generator, the reference clock, the period data and the test pattern signal being input to the timing generator so that the timing generator outputs a formatted clock signal and a comparative clock signal;
   a waveform formatter which formats the formatted clock signal to output and send a formatted pattern signal to a semiconductor device; and
   a logical comparison circuit which compares a response output of the semiconductor device with the expected pattern signal on the basis of the comparative clock signal,
   wherein the timing generator includes a variable delay circuit to provide a predetermined delay amount to a timing signal and then output the timing signal, wherein the variable delay circuit comprising:
   a delay circuit having a plurality of cascaded clock buffers;
   a plurality of AND circuits each being provided to correspond to each stage of the delay circuit divided by a predetermined delay time, a clock being input to one input terminal of the AND circuit from the corresponding stage of the delay circuit; and
   a plurality of data buffers each being connected to other input terminal of corresponding one of the plurality of AND circuits, the data buffer receiving delay amount data and providing a given delay amount to the received data and then sending the data to the AND circuits,
   wherein the delay amount provided to the data by the data buffer is the same as the delay amount provided to the clock by the clock buffer of the stage corresponding to the AND circuit to which the data buffer is connected.

6. The semiconductor test apparatus according to claim 5, wherein the timing generator further comprising:
   a delay locked loop circuit which is provided with a clock signal input to the delay circuit and a clock signal output from the delay circuit, wherein the delay locked loop circuit generates a bias signal on the basis of these clock signals and provides the bias signal to the data buffer.

7. The semiconductor test apparatus according to claim 6, wherein the timing generator further comprising:

a data holding circuit which is provided with the delay amount data, wherein the clock input to the delay circuit is input to the data holding circuit, and wherein the data holding circuit outputs the delay amount data in accordance with the input timing of this clock and sends the delay amount data to data buffer.

* * * * *